United States Patent
Pan

[11] Patent Number: 6,144,606
[45] Date of Patent: Nov. 7, 2000

[54] METHOD AND SYSTEM FOR BI-DIRECTIONAL VOLTAGE REGULATION DETECTION

[75] Inventor: Feng Pan, Richmond, Calif.

[73] Assignee: Advanced Micro Devices, Inc., Sunnyvale, Calif.

[21] Appl. No.: 09/417,732

[22] Filed: Oct. 14, 1999

[51] Int. Cl.[7] ........................................................ G11C 7/00

[52] U.S. Cl. ................ 365/226; 365/189.07; 365/189.09

[58] Field of Search ............................... 365/226, 189.07, 365/189.09, 227, 189.06

[56] References Cited

U.S. PATENT DOCUMENTS 6,052,325  4/2000  Merritt ...................................... 365/226

Primary Examiner—David Nelms
Assistant Examiner—David Lam
Attorney, Agent, or Firm—Brinks Hofer Gilson & Lione

[57] ABSTRACT

The present invention discloses a method and system of performing bi-directional voltage detection for a regulated voltage supply output in a memory device during a program verify operation. In the preferred embodiment, a voltage regulator is used to generate the regulated voltage supply output. The regulated voltage supply output is directed to a bi-directional voltage regulation detector and a transfer circuit. During operation, an output signal is generated with the bi-directional voltage regulation detector when the regulated voltage supply output is within a predetermined voltage range. If the regulated voltage supply output is within the predetermined voltage range, the regulated voltage supply output is passed to at least one wordline with the transfer circuit once the output signal is received by the transfer circuit from the bi-directional voltage regulation detector.

19 Claims, 3 Drawing Sheets

METHOD AND SYSTEM FOR BI-DIRECTIONAL VOLTAGE REGULATION DETECTION

FIELD OF THE INVENTION

The present invention relates generally to non-volatile memory devices and, more particularly, to bi-directional monitoring of a regulated voltage supply output in flash electrically erasable programmable read-only memory (EEPROM).

BACKGROUND OF THE INVENTION

A flash memory is a storage device that is capable of retaining stored information in the absence of continuous power. The information is stored in a plurality of flash transistors that are electrically connected and formed on a silicone substrate. A flash transistor is typically referred to as a cell and includes a source, a drain, a floating gate and a control gate. Flash memory devices are formed by rows and columns of flash transistors that form a flash transistor array. The flash transistor array is in the form of a matrix where the control gates of the cells are electrically connected with a respective wordline and the drains of the cells are electrically connected with a respective bitline.

The information stored in each cell is in the form of binary ones and zeros, as known in the art. To perform an erase, read or program operation of a particular cell in the array, a predetermined voltage is applied to a respective wordline, bitline and source of the chosen cell. By applying the voltages to a predetermined bitline and wordline, an individual cell can be read or programmed.

To program a respective cell in the flash memory, the control gate and drain of the cell to be programmed are raised to predetermined programming voltages and the source is grounded. When the programming voltages are placed on the wordline and the bitline, hot electrons are injected onto the floating gate where they are trapped forming a negative charge. As known in the art, this electron transfer mechanism is often referred to as Channel Hot Electron (CHE) injection in the semiconductor industry. When the predetermined programming voltages are removed, the negative charge on the floating gate is maintained, thereby raising the threshold voltage of the cell.

In order to read a given cell, the threshold voltage of the cell is measured to determine if the cell is in a charged (programmed) or an uncharged (un-programmed) state. Cells are read by applying a predetermined voltage to the wordline and the bitline, grounding the source of the cell and then sensing the current on the bitline. If the cell is programmed, the threshold voltage will be relatively high and the bitline current will be zero or at least relatively low when the predetermined voltage is applied between the control gate and the drain of the cell. If the cell is not programmed or erased, the threshold voltage will be relatively low and the bitline current will be relatively high when the predetermined voltage is applied.

The typical programming operation is performed in small steps by application of the predetermined programming voltages to a targeted cell for a short period of time followed by a program verify operation. The program verify operation reads the state of the targeted cell to determine if the threshold voltage has been raised to the desired level. The predetermined programming voltages are applied in short, repetitive pulses with the program verify operation occurring after each pulse. When the targeted cell is read during the program verify operation and determined to be at the desired threshold voltage, the programming pulses are no longer applied.

Typically, the threshold voltage is determined from the bitline current of the targeted cell during the program verify operation by comparing the bitline current of the targeted cell with a reference current in a sensing circuit. If the targeted cell conducts with a current greater than or equal to the reference current, it is unprogrammed and if the targeted cell conducts a current that is less than the reference current, it is programmed. The reference current is generated from a group of unprogrammed reference cells in the sensing circuit that are subjected to the same wordline and bitline voltages as the cell targeted for programming. If the targeted cell that has been subject to a program pulse conducts a current at or above the reference current, the programming operation is not complete and additional programming pulses and program verify operations are required.

Known problems occur during the program verify operation when the voltage applied to the wordline is not within a predetermined voltage range. If the voltage applied to the wordline is too high, the cells on that wordline can be physically damaged or there can be a disturbance of the threshold voltage of the cells. In addition, applying a voltage that is too high can also cause data retention failure within the cells. High voltages on the wordline can also affect the endurance of the cells on a given wordline. If the wordline voltage is too low, insufficient bitline current may be developed to properly read and thereby verify the targeted cell.

To avoid the problems associated with introducing voltages to the wordlines that are outside the predetermined voltage range during the program verify operation, it is known in the art to provide a regulated voltage supply that generates the required voltages. The regulated voltage supply is generated by a voltage regulator that is designed to hold an output voltage constant during variations in the output load on a supply voltage (Vcc). However, even though the regulated voltage supply is regulated by the voltage regulator, it is still possible that the regulated voltage supply will not fall within the acceptable predetermined voltage range for introduction of the voltage to the wordlines during the program verify operation.

Simple cost-effective voltage regulation detection circuits have commonly been applied in situations where achievement of the predetermined regulated voltage requires either raising or lowering the supply voltage (Vcc). Consequently, conventional voltage regulation detection circuits only monitor the regulated voltage in one direction. Currently, there is no cost-effective solution to eliminate the possibility of exposing the wordlines to voltages from the voltage regulator that are outside the predetermined voltage range in both directions.

To that end, a need exists for methods and systems capable of bi-directionally monitoring a regulated voltage supply output and applying the regulated voltage supply output to a circuit only when the voltage level falls within a predetermined range.

SUMMARY OF THE INVENTION

The present invention discloses a method of using bi-directional voltage detection for a regulated voltage supply in a memory device, which is a flash memory in the preferred embodiment. The regulated voltage supply output is generated using a voltage regulator and is directed to a bi-directional voltage regulation detector that senses the voltage level of the regulated voltage supply output. If the regulated voltage supply output is within a predetermined voltage range, a signal is sent from the bi-directional voltage regulation detector to at least one transfer circuit that indicates the regulated voltage supply output is within the predetermined voltage range. In the alternative, if the regulated voltage supply output is above or below the predetermined voltage range, a signal is sent from the bi-directional voltage regulation detector to at least one transfer circuit that indicates the regulated voltage supply output is not within the predetermined voltage range.

In the preferred embodiment of the present invention, the transfer circuit is electrically connected with at least one wordline in a memory sector. During operation, when a program verify is initiated, if the signal from the bi-directional voltage regulation detector indicates that the regulated voltage supply output is within the predetermined voltage range, the transfer circuit acts as a pass gate which directs the regulated voltage supply output to a predetermined wordline in the memory sector. Likewise, if the signal from the bi-directional voltage regulation detector indicates that the regulated voltage supply output is above or below the predetermined voltage range, the transfer circuit does not pass the regulated voltage supply output to the predetermined wordline. Thus, the bi-directional voltage regulation detector does not allow the transfer circuit to pass the regulated voltage supply output to the predetermined wordline when the program verify is initiated until the voltage level of the regulated voltage supply output is within the predetermined voltage range.

The present invention also discloses a flash memory that has a bi-directional voltage regulation detector that is capable of monitoring a regulated voltage supply output both above and below a predetermined voltage range. The preferred flash memory comprises at least a voltage regulator and a bi-directional voltage regulation detector that are electrically connected with a transfer circuit. The regulated voltage supply output from the voltage regulator is also connected with the bi-directional voltage regulation detector. In the preferred embodiment, the transfer circuit is electrically connected with a plurality of wordlines located in a memory sector of the flash memory. However, those skilled in the art would recognize that the present invention can be used in other applications that require the monitoring of a predetermined voltage range in two directions.

The preferred bi-directional voltage regulation detector comprises a capacitor divider circuit, a comparator circuit and an initialize circuit. The capacitor divider circuit is connected with the comparator circuit which is, in turn, connected with the initialize circuit. As previously stated, the bi-directional voltage regulation detector circuit is used to determine when the regulated voltage supply output from the voltage comparator is within a predetermined voltage range. If the regulated voltage supply output is not within the predetermined voltage range, the bi-directional voltage comparator will not send a signal to the transfer circuit indicating that it is safe to pass the regulated voltage supply output to the wordline. As previously set forth, the bi-directional voltage regulation detector is capable of stopping the transfer circuit from passing the regulated voltage supply output to the wordlines if the magnitude of the voltage generated by the voltage regulator is above or below the predetermined voltage range.

In the preferred embodiment, the transfer circuit acts as a switch that electrically connects the wordlines with the regulated voltage supply output when the bi-directional voltage regulation detector sends a signal to the transfer circuit indicating that the regulated voltage supply output is within the predetermined voltage range. The bi-directional voltage regulation detector will direct the transfer circuit to electrically connect the regulated voltage supply with the wordlines only when the regulated voltage supply output is within a predetermined voltage range. Those skilled in the art would recognize that several circuits exist that are capable of passing the regulated voltage supply output to the wordlines only if a predetermined signal is received by the bi-directional voltage regulation detector.

The present invention overcomes the problems associated with prior art flash memory by only allowing the regulated voltage supply output to be passed to a circuit if the magnitude of voltage falls within the predetermined voltage range. As previously set forth, if the voltage applied to certain circuits in flash memory is too high, it can physically damage the particular circuit. In particular, applying a voltage to wordlines that is too high can cause data retention failure within the cells on the wordlines as well as possibly physically damaging the cell. High voltages on the wordline can also affect the endurance of the cells on a given wordline. If the wordline voltage is too low, insufficient bitline current may be developed thereby causing errors when reading a particular cell. As readily apparent, the present invention provides advantages by ensuring that the regulated voltage supply output is not too high or low, but falls within the predetermined voltage range before being applied to a particular voltage sensitive circuit, such as the wordlines in the memory sector.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENTS OF THE INVENTION

The exemplary embodiments of the invention are set forth below with reference to specific configurations, and those skilled in the art would recognize that various changes and modifications could be made to the specific configurations while remaining within the scope of the claims. The invention may be used with any type of memory device requiring regulated voltage supply detection; however, the preferred embodiment of the invention is designed for flash memory.

All electrical parameters are given by example only and the present invention can be modified for use with various memory devices using other electrical parameters. For example, in the preferred embodiment of the invention set forth below, a supply voltage (Vcc) is 5 V and a regulated voltage supply output is 5 V. Those skilled in the art would recognize that the supply voltage (Vcc) could alternatively be 3.3 V, 1.8 V or some other supply voltage. Further, those skilled in the art would recognize that the regulated voltage supply output could also be some other voltage value than set forth in the preferred embodiment.

Figure 1:
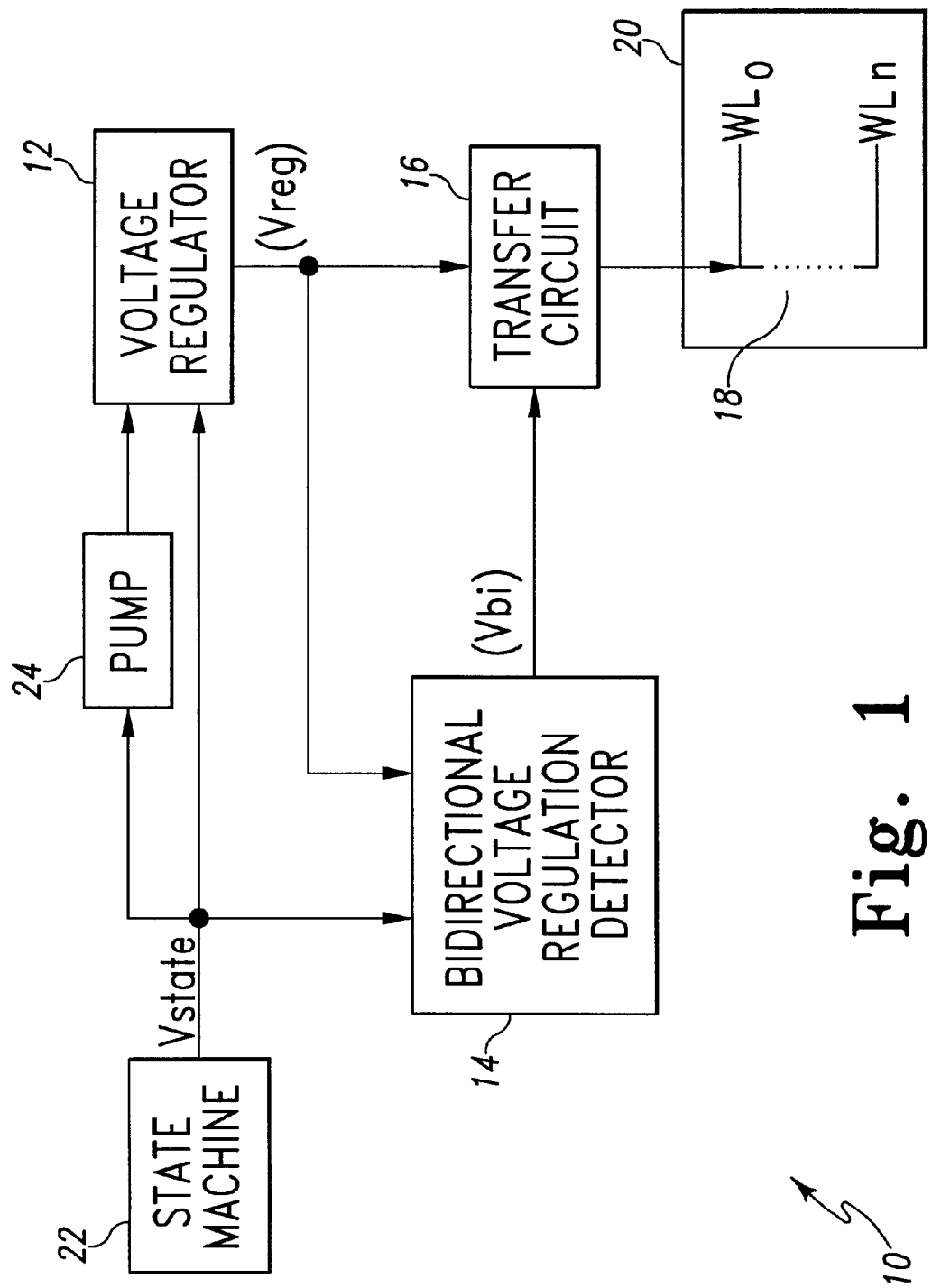
FIG. 1 is a block diagram of a portion of a preferred flash memory incorporating the present invention.

FIG. 1 illustrates a block diagram of a portion of a preferred flash memory 10 that incorporates an embodiment of the present invention. The flash memory 10 comprises a voltage regulator 12, a bi-directional voltage regulation detector 14, a transfer circuit 16, a plurality of wordlines 18 in at least one memory sector 20, a state machine 22 and a charge pump 24. In the preferred embodiment of the invention, the (Vreg) output of the voltage regulator 12 is electrically connected with the bi-directional voltage regulation detector 14 and the transfer circuit 16. The transfer circuit 16 is electrically connected with the bi-directional voltage regulation detector 14 and at least one respective wordline 18 in the memory sector 20. The state machine 22 is electrically connected with the bi-directional voltage regulation detector 14 and the charge pump 24. The voltage regulator 12 is also electrically connected with the output of the charge pump 24.

In the present invention, the voltage regulator 12, the bi-directional voltage regulation detector 14 and the charge pump 24 are enabled during a program verify operation. The program verify operation involves reading a plurality of cells that are located in each respective wordline 18 of the memory sector 20 to confirm that each cell has reached a sufficient threshold voltage during the programming operation. In the preferred embodiment, the bi-directional voltage regulation detector 14 is used to ensure that the voltage directed to the wordlines 18 in the memory sector 20 is within a predetermined voltage range during the program verify operation. Although the preferred embodiment of the present invention is set forth as it relates to program verify operations, those skilled in the art would recognize that the present invention could be used in other operations as well.

At the beginning of the program verify operation, the voltage regulator 12, the bi-directional voltage regulation detector 14 and the charge pump 24 are activated by a signal from the state machine 22. As known in the art, the state machine 22 is used to control the overall operation of the flash memory 10 in response to instruction sets that are received by the state machine 22. In the preferred embodiment, it is only necessary to understand that the state machine 22 generates predetermined signals during the program verify operation. The predetermined signal from the state machine 22 is used to activate the voltage regulator 12, the bi-directional voltage regulation detector 14, and the charge pump 24.

Prior to initiating the program verify operation, the (Vreg) output of the voltage regulator 12 is the same as a supply voltage (Vcc). Those skilled in the art would recognize that the supply voltage (Vcc) is the unregulated power supply of the flash memory 10. When the voltage regulator 12 and the charge pump 24 are activated by the state machine 22, the supply voltage (Vcc) may vary from 4.5 V to 5.5 V. If the supply voltage (Vcc) is high, the voltage regulator 12 will lower it. If the supply voltage (Vcc) is low, the charge pump 24 will raise it so that it can be regulated down by the voltage regulator 12. Those skilled in the art would recognize that the charge pump 24 is an electric circuit capable of increasing a small input voltage to a larger output voltage. Charge pumps are known in the art and several different charge pumps exist that can be used in the preferred embodiment. Therefore, a detailed discussion of charge pumps is not necessary for understanding the present invention.

To read a cell during the program verify operation, the voltage regulator 12 must be activated so that the (Vreg) output of the voltage regulator 12 and the charge pump 24 can be directed to the respective wordline 18 by the transfer circuit 16. As previously set forth, the (Vreg) output of the voltage regulator 12 is electrically connected with the bi-directional voltage regulation detector 14 and the transfer circuit 16. When the program verify is initiated, the bi-directional voltage regulation detector 14 monitors the (Vreg) output of the voltage regulator 12. The bi-directional voltage regulation detector 14 also controls the transfer circuit 16 to prohibit the output of the voltage regulator 12 from being applied to the respective wordline 18 if the (Vreg) output of the voltage regulator 12 is outside a predetermined voltage range.

The predetermined voltage range is equal to an allowable range of voltage that can be applied to the respective wordline 18 that allows the cell to be correctly read without causing damage to the non-selected cells in the wordline 18 or disturbing the threshold voltage or causing data retention failure within the non-selected cells. In the present preferred embodiment of the invention, the predetermined voltage range is 4.95–5.05 V during the program verify operation. Those skilled in the art would recognize that the present invention may be modified to be used with other voltage ranges and the voltage range set forth above should not be construed as a limitation of the present invention.

Once the bi-directional voltage regulation detector 14 determines that the (Vreg) output of the voltage regulator 12 is within the predetermined voltage range, the bi-directional voltage regulation detector 14 sends a signal to the transfer circuit 16, thereby causing the transfer circuit 16 to electrically connect the (Vreg) output of the voltage regulator 12 with the respective wordline 18. If the (Vreg) output of the voltage regulator 12 is not within the predetermined voltage range, the bi-directional voltage regulation detector 14 does not signal the transfer circuit 16 to connect the wordlines 18 to the output of the voltage regulator 12 until the (Vreg) output is within the predetermined voltage range. Once the output (Vreg) of the voltage regulator 12 is electrically connected to the wordlines, the bi-directional voltage regulation detector 14 no longer monitors the output V(reg) of the voltage regulator 12 and controls the transfer circuit 16.

In the preferred embodiment of the present invention, the transfer circuit 16 is a decoder circuit that transfers the (Vreg) output of the voltage regulator 12 to the chosen wordline 18 in the memory sector 20. As known in the art, a fundamental component of any memory device is the decoder circuits. In general, decoder circuits output a predetermined signal if, and only if, all of the bits of an address input correspond to a predetermined set of values. For the purposes of the present invention, it is only necessary to recognize that the transfer circuit 16 directs the (Vreg) output of the voltage regulator 12 only if the (Vreg) output of the voltage regulator 12 is within the predetermined voltage range. Those skilled in the art would recognize that various transfer circuits 16 exist and may be used in the present invention.

The voltage regulator 12 used in the preferred embodiment of the present invention is a DC-to-DC voltage regulator that is used to lower the supply voltage (Vcc) to a regulated DC output voltage. As know in the art, DC-to-DC voltage regulators are designed to provide a well-regulated voltage, regardless of variations in the load resistance and/or the supply voltage (Vcc). Those skilled in the art would recognize that several voltage regulators may be used in the present invention and that a detailed discussion of voltage regulators is not necessary for the present invention.

Figure 2:
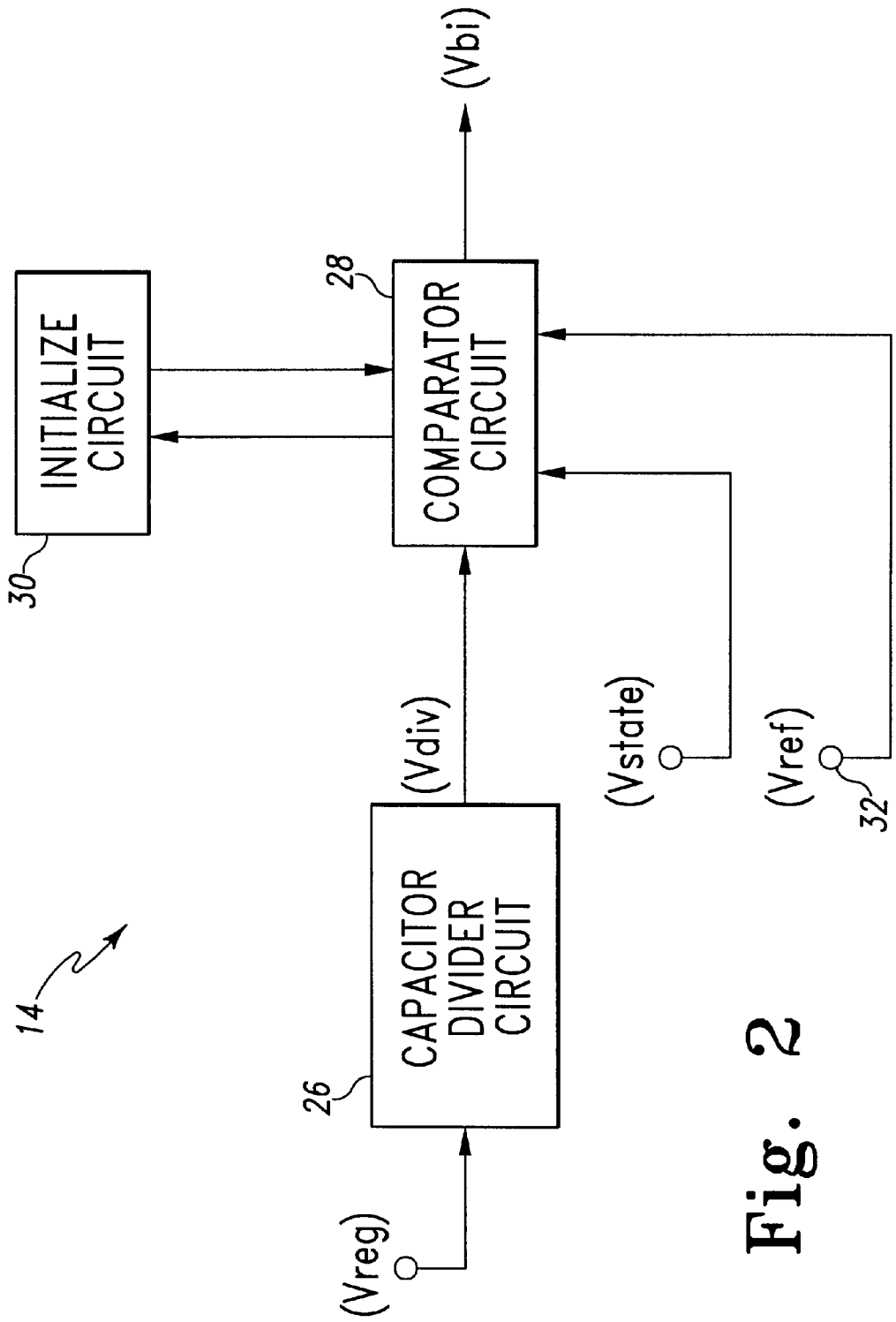
FIG. 2 is a block diagram of the bi-directional voltage detection circuit.

Referring to FIG. 2, generally speaking, the bi-directional voltage regulation detector 14 includes a capacitor divider circuit 26, a comparator circuit 28 and an initialize circuit 30. The capacitor divider circuit 26 and the initialize circuit 30 are electrically connected with the comparator circuit 28.

The (Vreg) output of the voltage regulator 12 is electrically connected with the capacitor divider circuit 26. The (Vstate) output of the state machine 22 and a reference voltage node 32 are electrically connected with the comparator circuit 28. The comparator circuit 28 is also electrically connected with the capacitor divider 26 and the initialize circuit 30.

When the state machine 22 activates the voltage regulator 12, the bi-directional voltage regulation detector 14 and the charge pump 24, the (Vreg) output of the voltage regulator 12 is applied to the capacitor divider circuit 26. The capacitor divider circuit 26 creates a divider voltage that has a fast response to changes in the voltage level generated by the voltage regulator 12. As is known to those skilled in the art, the divider voltage (Vdiv) represents a mirror of the (Vreg) output of the voltage regulator 12 that has been reduced in magnitude to use very little power and provide an almost instantaneous response to changes in the voltage generated by the voltage regulator 12.

During operation, to determine if the (Vreg) output of the voltage regulator 12 is within the predetermined voltage range, the divider voltage (Vdiv) is compared to a predetermined reference voltage (Vref) that is connected with the comparator circuit 28 by the reference voltage node 32. As a result of this comparison, a divergence voltage is generated. The divergence voltage is an analog signal that represents the degree of positive or negative variation from the predetermined reference voltage (Vref) and can be correlated to a minimum and a maximum voltage in the predetermined voltage range. The reference voltage (Vref) is generated by the reference voltage node 32, which could be generated from several circuits known in the art. In the preferred embodiment, the reference voltage (Vref) is 1.3 V, but those skilled in the art would recognize that this value could vary.

If the difference between the divider voltage (Vdiv) and the predetermined reference voltage (Vref) is within the predetermined voltage range, the (Vbi) output of the comparator circuit 28 sends an electric signal to the transfer circuit 16 that causes the transfer circuit 16 to electrically connect the (Vreg) output of the voltage regulator 12 with the select wordline 18 in the memory sector 20. Conversely, where the difference between the divider voltage (Vdiv) and the reference voltage (Vref) is outside the predetermined voltage range, the (Vbi) output of the comparator circuit 28 sends an electric signal to the transfer circuit 16 that disables the transfer circuit 16 from passing the (Vreg) output of the voltage regulator 12 to the select wordlines 18. In the preferred embodiment of the present invention, when the voltage regulator 12, the bi-directional voltage regulation detector 14 and the charge pump 24 are initially enabled, the (Vbi) output is also disabled to ensure that the (Vreg) output of the voltage regulator 12 is not passed to the select wordline 18, thereby potentially damaging any cells in the select memory sector 20.

Figure 3:
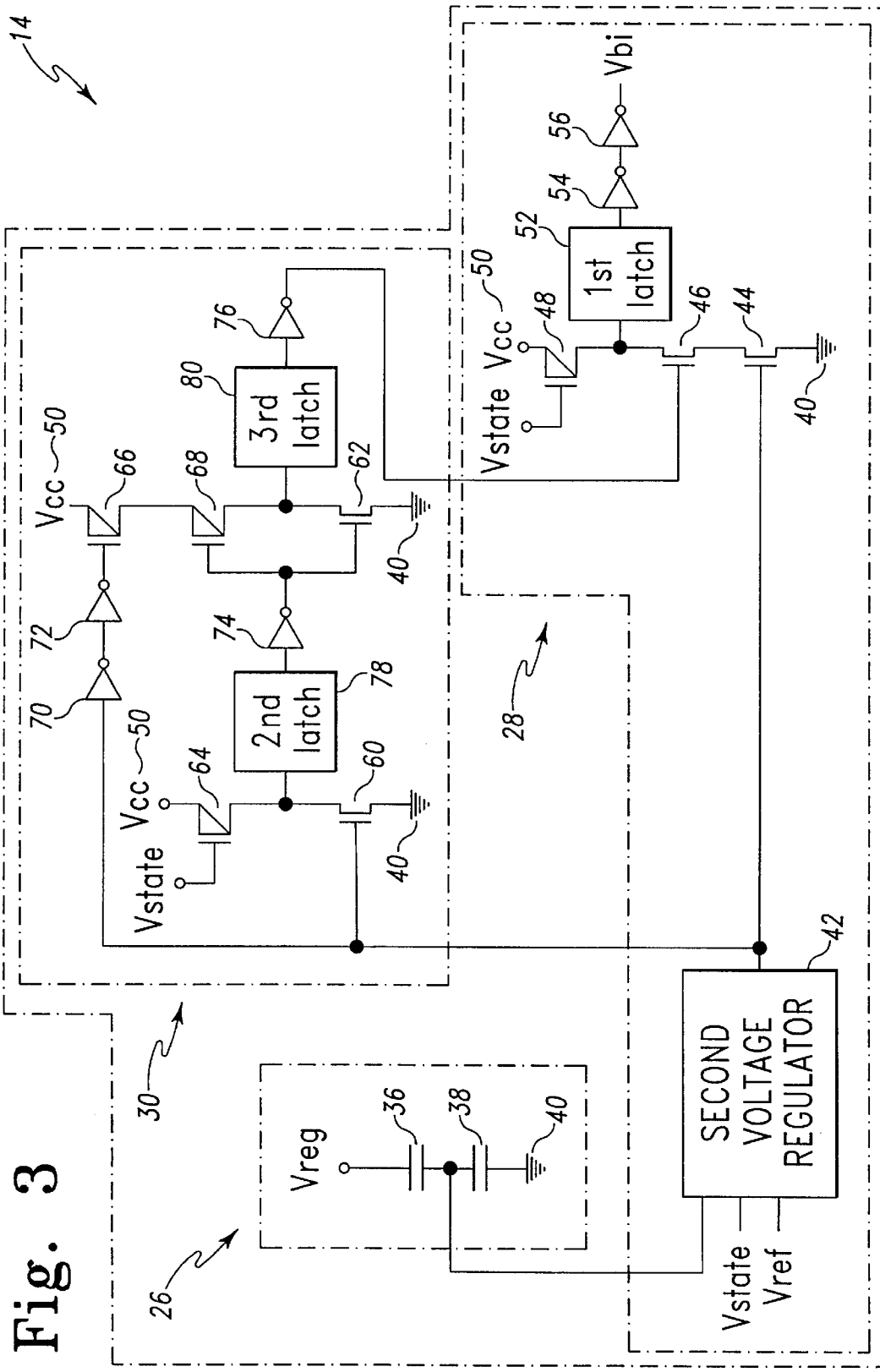
FIG. 3 is a detailed circuit schematic of the bi-directional voltage detection circuit illustrated in FIG. 2.

FIG. 3 illustrates a circuit schematic of a preferred embodiment of the bi-directional voltage regulation detector 14. In the preferred embodiment, the capacitor divider circuit 26 comprises a first capacitor 36, a second capacitor 38, and a ground connection 40 electrically connected as illustrated in FIG. 3. The (Vreg) output of the voltage regulator 12 is electrically connected with the first capacitor 36. As previously set forth, the (Vdiv) output of the capacitor divider circuit 26 is electrically connected with the comparator circuit 28. Those skilled in the art would recognize that the function performed by the capacitor divider circuit 26 is commonly known in the art and that variations exist that can achieve similar results.

In the preferred embodiment, the comparator circuit 28 comprises a second voltage regulator circuit 42, an n-channel transistor 44, a plurality of p-channel transistors 46, 48, a supply voltage (Vcc) connection 50, a first latch 52, a plurality of inverters 54, 56 and the ground connection 40 electrically connected as illustrated in FIG. 3. In particular, the gate of n-channel transistor 44 is connected with the output of the second voltage comparator circuit 42, the drain of n-channel transistor 44 is connected with the source of n-channel transistor 46 and the source of transistor 44 is connected with the ground connection 40. The gate of n-channel transistor 46 is connected with the output of the initialize circuit 30 and the drain of n-channel transistor 46 is connected with the drain of p-channel transistor 48. The source of transistor 48 is connected with the supply voltage (Vcc) connection 50 and the gate of p-channel transistor 48 is connected with the (Vstate) output of the state machine 22.

The first latch 52 is connected between the drain of n-channel transistor 46 and the drain of p-channel transistor 48. The output of the first latch 52 is connected with the input of inverter 54 and the output of inverter 54 is connected with the input of inverter 56. Although not illustrated in FIG. 3, the output of inverter 56 is the (Vbi) output of the bi-directional voltage regulator detector 14, which is electrically connected, with an input of the transfer circuit 16. As previously set forth, when the (Vreg) output of the voltage regulator 12 is within the predetermined voltage range the bi-directional voltage regulator detector 14 generates an output signal that causes the transfer circuit 16 to direct the (Vreg) output to the predetermined wordline 18.

Referring once again to FIG. 3, the initialize circuit 30 comprises a plurality of n-channel transistors 60, 62, a plurality of p-channel transistors 64, 66, 68, a plurality of inverters 70, 72, 74, 76, a second latch 78, a third latch 80, the supply voltage connection 50 and the ground connection 40 electrically connected as illustrated. The output of the second voltage regulator 42 is connected with the gate of n-channel transistor 60 and the input of inverter 70. The drain of n-channel transistor 60 is connected with the drain of p-channel transistor 64 and the source of n-channel transistor 60 is connected with the ground connection 40. The gate of p-channel transistor 64 is connected with the (Vstate) output from the state machine 22, and the source of p-channel transistor 64 is connected with the supply voltage (Vcc) connection 50. The output of inverter 70 is connected with the input of inverter 72 and the output of inverter 72 is connected with the gate of p-channel transistor 66. The source of p-channel transistor 66 is connected with the supply voltage (Vcc) connection 50.

As further illustrated in FIG. 3, the input of the second latch 78 is connected with the drain of p-channel transistor 64 and the drain of n-channel transistor 60. The output of latch 74 is connected with the gate of p-channel transistor 68 and the gate of n-channel transistor 62. The drain of p-channel transistor 68 is connected with the drain of p-channel transistor 66 and the source of p-channel transistor 68 is connected with the drain of n-channel transistor 62. The input of the third latch 80 is connected with the source of p-channel transistor 68 and the drain of n-channel transistor 62. The output of the third latch is connected with the input of inverter 76 and the output of inverter 76 is connected with the gate of n-channel transistor 46 of the comparator circuit 28.

During the program verify operation, the bi-directional voltage regulation detector 14 is enabled by the (Vstate) output from the state machine 22. In addition, the (Vstate)

output of the state machine 22 enables the voltage regulator 12 and the charge pump 24 during the program verify operation. As such, when the (Vstate) output is energized, the (Vreg) output of the voltage regulator 12 is applied to the capacitor divider circuit 26. In the preferred embodiment, the output of the first latch 52 and the output of the second latch 78 are preset to be low, while the output of the third latch 80 is preset high. The (Vbi) output of the bi-directional voltage regulation detector 14 is initially deenergized due to the preset low output of the first latch 54. Therefore, the transfer circuit 16 initially does not direct the (Vreg) output of the voltage regulator 12 to the wordlines 18 in the memory sector 20.

The program verify operation can occur at anytime in the flash memory 10, creating two likely scenarios when the state machine 22 enables the voltage regulator 12, the bi-directional voltage regulation detector 14 and the charge pump 24. When it is enabled by the state machine 22, the (Vreg) output of the voltage regulator 12 can be too low to be within the predetermined voltage range or can be too high to be within the predetermined voltage range. To fully disclose the complete operation of the present invention, each of these situations will be discussed with respect to the program verify operation in the flash memory 10.

Regardless of which scenario occurs in the present invention, when the (Vreg) output of the voltage regulator 12 is applied to the capacitor divider circuit 26, the capacitors 36, 38 quickly charge up to a combined voltage equal to the voltage of the (Vreg) output of the voltage regulator 12. The divider voltage (Vdiv) of the capacitor divider circuit 26 is directed to the second voltage regulator 42 of the comparator circuit 28 and is equal to the voltage drop across capacitor 38. The voltage drop across capacitor 38 is compared with the reference voltage (Vref) by the second voltage regulator 42, which generates an analog output in response to the comparison. As known in the art, the second voltage regulator 42 is a solid state device that compares the divider voltage (Vdiv) with the reference voltage and generates an analog voltage output based on the comparison. In the preferred embodiment, the analog output from the second voltage comparator 42 is at a median value of the (Vreg) output when the compared voltages are equal.

If the divider voltage (Vdiv) goes below the reference voltage (Vref), the analog output of the second voltage regulator 42 will go below the median value by a magnitude corresponding to the difference in the compared voltages. Conversely, if the divider voltage (Vdiv) goes above the reference voltage (Vref), the analog output voltage of the second voltage regulator 42 will go above the median value by a magnitude corresponding to the difference in the compared voltages. As the voltage divider (Vdiv) exceeds the predetermined reference voltage (Vref), the analog output will rise. Conversely, when the divider voltage (Vdiv) is below the reference voltage (Vref), the analog output will fall. Those skilled in the art recognize that variations exist in the design of voltage regulators and that several voltage regulators could be used in the present invention.

In addition, regardless of which of the above-referenced scenarios occurs in the present invention, the analog output signal from the second voltage regulator 42 is converted to a digital signal by inverters 70, 72 to effectively make transistor 66 act as a voltage sensitive on-off switch. Transistor 66 will act as a transfer gate when the voltage at the gate of transistor 66 is low, or act as an open circuit when the voltage at the gate of transistor 66 is high. Since inverters 70, 72 are used to create a low or high output voltage, the input to the gate of the transistor 66 will only be either the digital low or high (5 V or 0 V) thereby creating the on-off switch. Those skilled in the art would recognize that inverters are well known in the art and, as such, a detailed discussion of inverters is not necessary for the present invention.

As set forth above, in the first scenario the (Vreg) output of the voltage regulator 12 is less than the predetermined voltage range. As such, the magnitude of the voltage produced by the analog output of the regulator 42 is too low to energize transistor 44 of the comparator circuit 28 and transistor 60 of the initialize circuit 30. Since there are no pull-down paths present for the first latch 52 and the second latch 78, the (Vbi) output remains disabled thereby directing the transfer circuit 16 to electrically connect the selected wordline 18 with the ground connection 40. As the charge pump 24 increases the supply voltage (Vcc), the (Vreg) output of the voltage regulator 12 approaches the predetermined voltage range. At the same time, the analog output from the second voltage regulator 42 of the comparator circuit 28 will rise to the threshold voltage of transistor 44 of the comparator circuit 28 and transistor 60 of the initialize circuit 30. Once transistor 60 and transistor 44 become energized, they act as transfer gates providing a path to the ground connection 40.

The path created to the ground connection 40 by transistor 60 is known in the art as a pull-down path, which, in the present invention, causes the second latch 78 to toggle. In the preferred embodiment, the second latch 78 acts as an inverter and as such, when its input goes low, its output goes high. The high output from the second latch 78 deenergizes transistor 62 from being a transfer gate and energizes transistor 68 to be a transfer gate. Since the analog output from the second voltage regulator 42 is below the operational threshold of inverter 70, transistor 66 remains energized, thereby acting as a transfer gate creating a pull-up path for the third latch 80 changing its input from a low to a high. The low output of the third latch 80 energizes transistor 46 of the comparator circuit 28.

Since transistor 44 of the comparator circuit 28 is already energized when transistor 46 is energized, a pull-down path to the ground connection 40 is created for the first latch 52, causing its output to toggle from low to high. When the output of the first latch 52 goes high, the (Vbi) output of the bi-directional voltage regulation detector 14 is enabled, thereby directing the transfer circuit 16 to electrically connect the (Vreg) output of the voltage regulator 12 with the predetermined wordline 18 in the memory sector 20.

In the second scenario, when the state machine 22 enables the voltage regulator 12, the bi-directional voltage regulation detector 14 and the charge pump 24, the (Vreg) output is above the predetermined voltage range. The analog output from the second voltage regulator 42 energizes transistor 44 of the comparator circuit 28 and transistor 60 of the initialize circuit 30 to become transfer gates, thereby providing a path to the ground connection 40. The pull-down path to the ground connection 40 created by transistor 60 causes the output of the second latch 78 to go high. The high output from the second latch 78 deenergizes transistor 62 from acting as a transfer gate and energizes transistor 68 to act as a transfer gate. Since the analog output from the second voltage regulator 42 is above the operational threshold of inverter 70, transistor 66 is deenergized and the third latch 80 has no pull-up path and, consequently, does not toggle from its current high output. Since the output of the third latch 80 stays high, transistor 46 is not energized and no pull-down path is created for the first latch 52. Since the output of the first latch 52 stays low, the (Vbi) output of the bi-directional voltage regulation detector 14 is disabled, thereby directing the transfer circuit 16 to electrically connect the wordline 18 with the ground connection 40.

When the (Vreg) output of the voltage regulator 12 is regulated to a magnitude within the predetermined voltage range, the analog output of the second voltage regulator 42 will be reduced in magnitude. The reduction in magnitude of the analog output from the second voltage regulator 42 drops below the threshold voltage of inverter 70, thereby energizing transistor 66. Transistor 66 provides a pull-up path for the third latch 80, which toggles thereby energizing transistor 46 of the comparator circuit 28. Transistor 46, in conjunction with transistor 44, completes the pull-down path for the first latch 52 causing it to toggle high. When the output of the first latch 52 goes high, the (Vbi) output is enabled thereby directing the transfer circuit 16 to electrically connect the (Vreg) output of the voltage regulator 12 with the selected wordline 18.

At the conclusion of the program verify operation, the state machine 22 disables the voltage regulator 12, the bi-directional voltage regulation detector 14 and the charge pump 24. As part of the deactivation of the bi-directional voltage regulation detector 14, the capacitor divider circuit 26 is discharged, the first latch 52 and the second latch 78 are reset to a low output and the third latch 80 is reset to a high output. When another program verify operation in the flash memory 10 is needed, the state machine activates the voltage regulator 12, the bi-directional voltage regulation detector 14, the charge pump 24 and the operation detailed above repeats.

While the invention has been described in its currently best known modes of operation and embodiments, other modes and embodiments of the invention will be apparent to those skilled in the art. It is the following claims, including all equivalents that are intended to define the spirit and scope of the invention.

What is claimed is:

1. A method of performing bi-directional voltage detection for a regulated voltage supply in a memory device, comprising the steps of:
   generating an output from said regulated voltage supply by way of a voltage regulator;
   directing said regulated voltage supply output to a bi-directional voltage regulation detector;
   using said bi-directional voltage regulation detector to sense said regulated voltage supply output and generate an output signal when said regulated voltage supply output is within a predetermined voltage range; and
   directing said output signal from said bi-directional voltage regulation detector to at least one transfer circuit.

2. The method of claim 1, further comprising the step of directing said regulated supply output from said transfer circuit to at least one wordline in said memory device.

3. The method of claim 1, wherein said bi-directional voltage regulation detector comprises a capacitor divider circuit, a comparator circuit, and an initialize circuit.

4. The method of claim 1, wherein said voltage regulator and said bi-directional voltage regulation detector are controlled by a state machine.

5. The method of claim 4, wherein said voltage regulator and said bi-directional voltage regulation detector are activated during a program verify operation by said state machine.

6. The method of claim 1, wherein said predetermined voltage range is approximately 4.95–5.05 V.

7. A method of performing bi-directional voltage detection for a regulated voltage supply output in a memory device during a program verify operation, comprising the steps of:
   generating said regulated voltage supply output with a voltage regulator;
   directing said regulated voltage supply output to a bi-directional voltage regulation detector and a transfer circuit;
   generating an output from said bi-directional voltage regulation detector when said regulated voltage supply output is within a predetermined voltage range and directing said output to said transfer circuit; and
   passing said regulated voltage supply output to at least one wordline with said transfer circuit once said output is received by said transfer circuit from said bi-directional voltage regulation detector.

8. The method of claim 7, wherein said bi-directional voltage regulation detector comprises a capacitor divider circuit, a comparator circuit, and an initialize circuit.

9. The method of claim 8, wherein said regulated voltage supply output is compared to a predetermined reference voltage with comparator circuit that is generated by said capacitor divider circuit.

10. The method of claim 7, wherein said voltage regulator and said bi-directional voltage regulation detector are activated during said program verify operation by a state machine.

11. The method of claim 7, wherein said transfer circuit electrically connects said wordlines to a ground connection until said regulated voltage supply output is within said predetermined voltage range.

12. The method of claim 7, wherein said predetermined voltage range is approximately 4.95–5.05 V.

13. A memory device capable of performing bi-directional voltage regulation detection, comprising:
   a voltage regulator for generating a regulated voltage supply output;
   a bi-directional voltage regulation detector electrically connected to said voltage regulator to received said regulated voltage supply output, said bi-directional voltage regulation detector operable to generate an output signal if said regulated voltage supply output is within a predetermined voltage range; and
   a transfer circuit electrically connected to said voltage regulator and to said bi-directional voltage regulation detector, wherein said transfer circuit is activated by said output signal of said bi-directional voltage regulation detector.

14. The memory device of claim 13, wherein said bi-directional voltage regulation detector includes a capacitor divider circuit, a comparator circuit, and an initialize circuit.

15. The memory device of claim 13, further comprising a state machine electrically connected with said voltage regulator and said bi-directional voltage regulation detector, wherein said state machine is used to activate said voltage regulator and said bi-directional voltage regulation detector.

16. The memory device of claim 15, wherein said state machine activates said voltage regulator and said bi-directional voltage regulation detector during a program verify operation.

17. The memory device of claim 13, further comprising at least one wordline electrically connected with said transfer circuit, wherein said transfer circuit passes said regulated voltage supply output to said wordline when activated by said bi-directional voltage regulation detector.

18. The memory device of claim 13, wherein said predetermined voltage range is an upper and lower limit voltage value that will not undesirably affect said memory device.

19. The memory device of claim 13, wherein said predetermined voltage range is 4.95–5.05 V.

* * * * *